(12) United States Patent
O'Hara

(10) Patent No.: US 10,354,884 B2
(45) Date of Patent: Jul. 16, 2019

(54) VAPOUR ETCH OF SILICON DIOXIDE WITH IMPROVED SELECTIVITY

(75) Inventor: Anthony O'Hara, West Lothian (GB)

(73) Assignee: MEMSSTAR LIMITED, Livingston (GB)

( * ) Notice: Subject to any disclaimer, the term of this patent is extended or adjusted under 35 U.S.C. 154(b) by 0 days.

(21) Appl. No.: 13/980,638

(22) PCT Filed: Jan. 24, 2012

(86) PCT No.: PCT/GB2012/050144
§ 371 (c)(1),
(2), (4) Date: Sep. 30, 2013

(87) PCT Pub. No.: WO2012/101431
PCT Pub. Date: Aug. 2, 2012

(65) Prior Publication Data
US 2014/0017901 A1    Jan. 16, 2014

(30) Foreign Application Priority Data
Jan. 24, 2011   (GB) .................................. 1101188.9

(51) Int. Cl.
*H01L 21/306*   (2006.01)
*H01L 21/311*   (2006.01)
*B81C 1/00*     (2006.01)

(52) U.S. Cl.
CPC .... *H01L 21/30604* (2013.01); *B81C 1/00595* (2013.01); *H01L 21/31116* (2013.01);
(Continued)

(58) Field of Classification Search
None
See application file for complete search history.

(56) References Cited

U.S. PATENT DOCUMENTS 6,048,406 A    4/2000  Misra et al.
6,475,917 B1 * 11/2002  Shen ................ H01L 21/31055
                                                    257/E21.245
(Continued)

FOREIGN PATENT DOCUMENTS

EP    1 382 569 A1    5/2003
GB       2473851 A    3/2011
(Continued)

OTHER PUBLICATIONS

Habuka, Japanese Journal of Applied Physics, Part 1 (Regular Papers, Short Notes & Review Papers), Nov. 1998, vol. 37, No. 11, pp. 6123-6127 "Reaction of hydrogen fluoride gas at high temperatures with silicon oxide film and silicon surface" [abstract only].

*Primary Examiner* — Shamim Ahmed
*Assistant Examiner* — Bradford M Gates
(74) *Attorney, Agent, or Firm* — Saul Ewing Arnstein & Lehr LLP

(57) ABSTRACT

The etching of a sacrificial silicon dioxide ($SiO_2$) portion in a microstructure such as a microelectro-mechanical structures (MEMS) by the use an etchant gas, namely hydrogen fluoride (HF) vapor is performed with greater selectivity to other portions within the MEMS, and in particular portions of silicon nitride ($Si_3N_4$). This is achieved by the addition of a secondary non-etchant gas suitable for increase the ratio of difluoride reactive species ($HF_2^-$ and $H_2F_2$) to monofluoride reactive species ($F^-$, and HF) within the HF vapor. The secondary non-etchant gas may comprise a hydrogen compound gas. The ratio of difluoride reactive species ($HF_2^-$ and $H_2F_2$) to the monofluoride reactive species ($F^-$, and HF) within the HF vapor can also be increased by setting an etch operating temperature to 20° C. or below.

14 Claims, 2 Drawing Sheets

(52) U.S. Cl.
CPC ............. *B81C 2201/0109* (2013.01); *B81C 2201/0132* (2013.01)

(56) References Cited

U.S. PATENT DOCUMENTS

| | | | |
|---|---|---|---|
| 8,187,486 B1 | 5/2012 | Liu et al. | |
| 2002/0195423 A1* | 12/2002 | Patel et al. | 216/73 |
| 2003/0080082 A1 | 5/2003 | Chinn et al. | |
| 2003/0166344 A1 | 9/2003 | Shimizu et al. | |
| 2004/0094086 A1* | 5/2004 | Shimaoka | H01L 21/31116 117/84 |
| 2004/0185583 A1 | 9/2004 | Tomoyasu et al. | |
| 2005/0106318 A1 | 5/2005 | Partridge et al. | |
| 2006/0216941 A1 | 9/2006 | Hasebe et al. | |
| 2009/0242129 A1* | 10/2009 | Onishi | H01L 21/31116 156/345.37 |
| 2009/0308843 A1* | 12/2009 | O'Hara | B81C 1/00476 216/59 |
| 2010/0129958 A1 | 5/2010 | Chang et al. | |

FOREIGN PATENT DOCUMENTS

| | | |
|---|---|---|
| JP | 55-045019 | 3/1980 |
| JP | 04-022123 | 1/1992 |
| JP | 07-086240 | 3/1995 |
| JP | 2006-261451 | 9/2006 |
| JP | 2009-94307 | 4/2009 |
| KR | 10-0870914 | 11/2008 |
| SU | 867233 A1 | 7/1993 |
| WO | 99/60620 | 11/1999 |
| WO | 03/055791 A2 | 7/2003 |
| WO | 2008/015434 A1 | 1/2008 |

\* cited by examiner

VAPOUR ETCH OF SILICON DIOXIDE WITH IMPROVED SELECTIVITY

CROSS REFERENCE TO RELATED APPLICATIONS

This application claims the priority of PCT/GB2012/050144, filed on Jan. 24, 2012, which claims the benefit of priority to Great Britain Application No. 1101188.9, filed on Jan. 24, 2011, the entire contents of which are hereby incorporated in total by reference.

The present invention relates to a method for improved selectivity to surrounding materials when etching silicon dioxide with a hydrogen fluoride (HF) vapour. In particular, the etch parameters are carefully controlled so as to enhance the selectivity with silicon nitride.

BACKGROUND TO THE INVENTION

In the manufacture of microstructures, for example micro-electro-mechanical structures (MEMS), etching processes are used to remove sacrificial (i.e. unwanted) areas of material. MEMS have found applications in inertial measurement, pressure sensing, thermal measurement, microfluidics, optics, and radio-frequency communications, and the range of possibilities for these structures continues to grow. Sacrificial layers are initially employed in the construction of the MEMS and then subsequently removed with an etch step, which allows the released structure to operate as designed. In order to produce reliable structures the release etch step is required to remove the sacrificial layer without etching the surrounding material. Ideally the etch of the sacrificial layer should have no impact at all on the remaining structure.

Many materials are known to be employed during the manufacture of MEMS e.g. silicon, silicon dioxide ($SiO_2$), silicon nitride ($Si_3N_4$), aluminium and photoresist to name but a few. Some of these materials are employed as the sacrificial materials while others are employed to define and hence form the MEMS. It is not uncommon during the manufacture of a MEMS for more than one sacrificial etch step to be employed. For example a film may initially be employed as a mask during a first sacrificial etch process and then be subsequently etched as the next sacrificial layer. In any release etch it is therefore highly desirable for there to be a high etch selectivity between the sacrificial layer and the surrounding materials.

A commonly employed approach to quantifying the selectivity of materials is to etch blanket films of those materials using the same etch arrangement and then compare the amount of material that has been removed. This technique is widely used and gives very useful information. However, in practice etch selectivity can be found to be dependent upon the materials present and the manner in which they have been deposited, the etch characteristics itself, and any subsequent treatments carried out on the MEMS.

By way of example, hydrogen fluoride (HF) vapour etching is commonly used to remove sacrificial areas of silicon dioxide in the manufacture of MEMS. This etch is a chemical etch, with no plasma being required, is performed at a process chamber pressure in the range of 18 T to 150 T and normally requires heating so as to achieve an operating temperature between 25° C. and 70° C. A catalyst is required for the HF vapour etch of silicon dioxide ($SiO_2$) to proceed. Water ($H_2O$) is often employed as the catalyst since this gives a fast and controlled etch, although alternatively catalysts known in the art include alcohols, methanol, ethanol and propanol. However, water ($H_2O$) (along with silicon tetrafluoride ($SiF_4$)) is a by-product of the reaction process and this means that the inherent etch characteristics can have a significant influence on the etch taking place. Therefore careful control of the process conditions is required.

The hydrogen fluoride (HF) vapour etching of silicon dioxide is known to exhibit high selectivity to many common films. For example, the theoretical selectivity to silicon and aluminium is high and no etching or corrosion is expected. However, the above described process conditions are also compatible for the hydrogen fluoride (HF) vapour to etch silicon nitride ($Si_3N_4$). Therefore in practice it can prove difficult to achieve a high selectivity between silicon dioxide ($SiO_2$) and silicon nitride ($Si_3N_4$) layers during a hydrogen fluoride (HF) vapour etch.

It is therefore an object of an embodiment of the present invention to provide apparatus and methods for the hydrogen fluoride (HF) vapour etch of silicon dioxide that exhibits increased selectivity to silicon nitride as compared to those techniques known in the art

SUMMARY OF THE INVENTION

According to a first aspect of the present invention, there is provided a method of selectively etching silicon dioxide ($SiO_2$) from silicon nitride ($Si_3N_4$) within a process chamber so as to produce one or more microstructures, the method comprising:

providing the process chamber with an etching vapour comprising hydrogen fluoride (HF); and increasing a ratio of difluoride reactive species ($HF_2^-$ and $H_2F_2$) to monofluoride reactive species ($F^-$, and HF) within the etching vapour.

Increasing the ratio of the difluoride reactive species ($HF_2^-$ and $H_2F_2$) to the monofluoride reactive species ($F^-$, and HF) within the etching vapour acts to significantly increase the selectivity of the etch process to silicon nitride ($Si_3N_4$).

Increasing the ratio of difluoride reactive species ($HF_2^-$ and $H_2F_2$) to monofluoride reactive species ($F^-$, and HF) within the etching vapour may comprise providing the process chamber with a non-etchant gas.

Preferably the non-etchant gas comprises a hydrogen compound gas. The hydrogen compound may comprise a compound selected from the group of compounds comprising hydrogen ($H_2$) ammonia ($NH_3$), methane ($CH_4$), ethane ($C_2H_6$) or mixtures thereof.

Alternatively the step of increasing the ratio of difluoride reactive species ($HF_2^-$ and $H_2F_2$) to monofluoride reactive species ($F^-$, and HF) within the etching vapour may comprise setting an etch operating temperature to 20° C. or below. Preferably the etch operating temperature is set to 10° C.

Preferably the method further comprises providing the process chamber with a catalyst. The catalyst preferably comprises water ($H_2O$) vapour.

The method may comprise the control of the amount of etching vapour and non etchant gas within the process chamber by controlling a vacuum pump rate out of the process chamber.

Alternatively, the method may comprise circulation of the etching vapour and non etchant gas through the process chamber.

It is preferable for the method to comprise the provision of a mask overlying the silicon dioxide so as to allow for selective etching of the silicon dioxide.

According to a second aspect of the present invention, there is provided a vapour phase etching apparatus for selectively etching silicon dioxide ($SiO_2$) from silicon nitride ($Si_3N_4$) so as to produce one or more microstructures, the apparatus comprising:
  a process chamber for receiving the silicon dioxide to be etched;
  a hydrogen fluoride (HF) vapour source;
  a non-etchant gas source wherein the non-etchant gas is suitable for increasing a ratio of difluoride reactive species ($HF_2^-$ and $H_2F_2$) to monofluoride reactive species ($F^-$, and HF) within a hydrogen fluoride (HF) vapour; and
  one or more gas lines that connect the hydrogen fluoride (HF) vapour source and the non-etchant gas source to the process chamber.

The vapour phase etching apparatus may comprise a catalyst source. Preferably the one or more gas lines connect the catalyst source to the process chamber.

Optionally a carrier gas source may provide a means for transporting the catalyst to the process chamber.

The catalyst may comprise water. The water may be in vapour form.

The vapour phase etching apparatus preferably comprises a temperature controller that provides a means for setting an etch operating temperature.

The vapour phase etching apparatus preferably comprises a vacuum pump connected to the process chamber. The vacuum pump provides a means for controlling the amount of etching vapour and/or non-etchant gas within the process chamber.

The vapour phase etching apparatus may further comprise one or more flow controllers connected to the one or more gas lines. The one or more flow controllers provide a means for controlling the amount of fluids e.g. the etching vapour and/or non-etchant gas reaching the process chamber.

Alternatively, the vapour phase etching apparatus is configured so as to recirculate the etching vapour and/or the non etchant gas.

Embodiments of the second aspect of the invention may include one or more features of the first aspect of the invention or its embodiments, or vice versa.

According to a third aspect of the present invention, there is provided a method of selectively etching silicon dioxide ($SiO_2$) from silicon nitride ($Si_3N_4$) in a process chamber so as to produce one or more microstructures, the method comprising:
  providing the process chamber with an etching vapour comprising hydrogen fluoride (HF); and
  providing the process chamber with a non-etchant gas suitable for increasing a ratio of difluoride reactive species ($HF_2^-$ and $H_2F_2$) to monofluoride reactive species ($F^-$, and HF) within the etching vapour.

The provision of a secondary gas suitable for increasing a ratio of difluoride reactive species ($HF_2^-$ and $H_2F_2$) to monofluoride reactive species ($F^-$, and HF) within the etching vapour acts to significantly increase the selectivity of the etch process to silicon nitride ($Si_3N_4$).

The method may further comprise setting an etch operating temperature to 20° C. or below. Preferably the etch operating temperature is set to 10° C.

Embodiments of the third aspect of the invention may include one or more features of the first or second aspects of the invention or its embodiments, or vice versa.

According to a fourth aspect of the present invention, there is provided a method of selectively etching silicon dioxide ($SiO_2$) from silicon nitride ($Si_3N_4$) in a process chamber so as to produce one or more microstructures, the method comprising:
  providing the process chamber with an etching vapour comprising hydrogen fluoride (HF) vapour; and
  setting an etch operating temperature to 20° C. or below.

The setting of the etch operating temperature to 20° C. or below acts to increase the ratio of difluoride reactive species ($HF_2^-$ and $H_2F_2$) to monofluoride reactive species ($F^-$, and HF) within the etching vapour and so significantly increases the selectivity of the etch to silicon nitride ($Si_3N_4$).

Preferably the etch operating temperature is set to 10° C.

The method may further comprise providing the process chamber with a non-etchant gas suitable for increasing a ratio of difluoride reactive species ($HF_2^-$ and $H_2F_2$) to monofluoride reactive species ($F^-$, and HF) within the etching vapour.

Embodiments of the fourth aspect of the invention may include one or more features of the first, second or third aspects of the invention or its embodiments, or vice versa.

BRIEF DESCRIPTION OF THE DRAWINGS

There will now be described, by way of example only, various embodiments of the invention with reference to the drawings, of which.

DETAILED DESCRIPTION OF PREFERRED EMBODIMENTS

Figure 1:
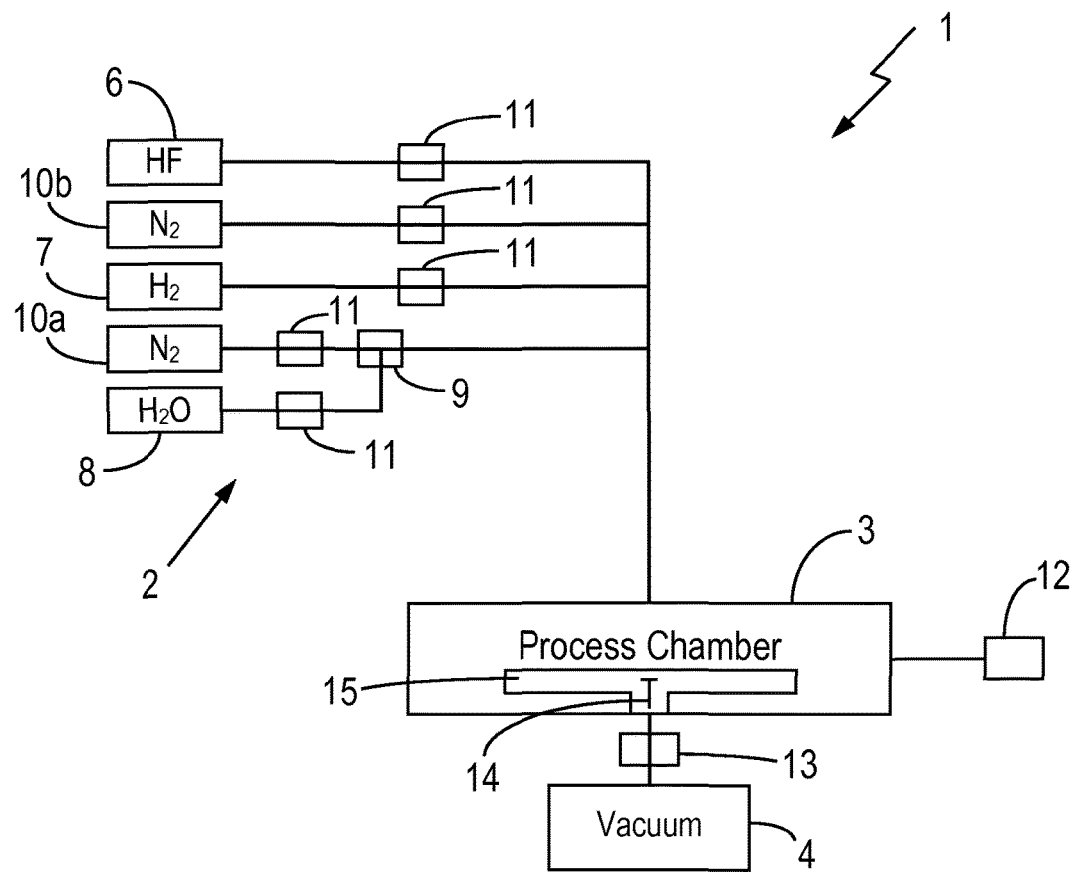
FIG. 1 illustrates in schematic form an HF vapour etch system in accordance with the present invention.

With reference to FIG. 1, there is presented an hydrogen fluoride (HF) vapour etch system 1 that comprises a gas delivery system 2 in fluid communication with a process chamber 3. A vacuum pump 4 in fluid communication with the process chamber 3 is also provided. This system enables an improved selectivity to silicon nitride ($Si_3N_4$) during an HF vapour etch of a sacrificial silicon dioxide ($SiO_2$) layer within a MEMS 5 located within the process chamber 3, as will be described in detail below.

The gas delivery system 2 comprises an HF vapour source 6, a hydrogen gas source 7, a water source 8, a vaporiser 9 and two nitrogen gas sources 10a and 10b. Water vapour for use within the process chamber 3 is produced by connecting the water source 8 to the vaporiser 9. The nitrogen gas sources 10a and 10b are optional elements, but when present the source 10a provides a carrier gas to assist in transporting the water vapour, employed as the catalyst for the HF vapour etch, to the process chamber 3 and source 10b provides a buffer gas for the vapour etch system 1. Mass or liquid flow controllers (MFC) 11 are preferably provided within each supply line of the gas delivery system 2 so as to provide a means for regulating the associated fluid flow.

A pressure gauge 12 is employed to monitor the pressure within the process chamber 3. The pump rate of the vacuum pump 4 and/or the MFCs 11 can be controlled to maintain a set operating pressure within the process chamber 3. The use of an adaptive pressure controller (APC) 13 enables accurate control of the process chamber 3 pressure. Note that in an alternative embodiment, the gases within the process chamber 3 may be circulated, in which case the vacuum pump 4 serves to initially evacuate the process chamber 3 (thus drawing in etchant vapour) or to evacuate the process chamber 3 subsequent to completion of the etch step.

A thermometer 14 is also connected to the process chamber 3, and preferably to a pedestal 15 located within the process chamber 3 upon which the MEMS 5 to be etched is located. When acting in conjunction with a temperature controller these elements provide a means for setting and maintaining an operating temperature for the HF vapour etch.

Figure 2A:
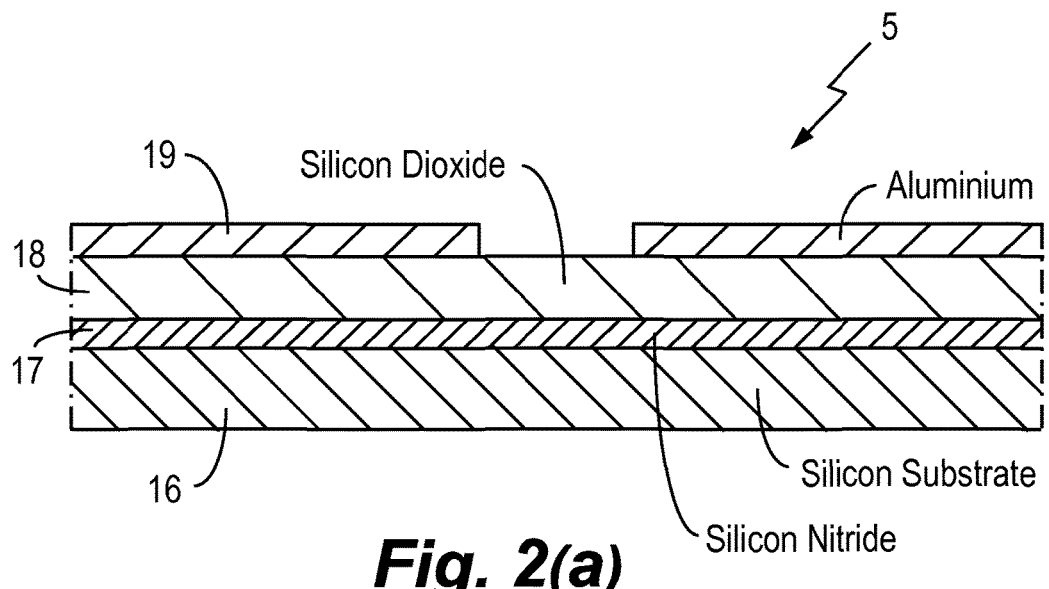
FIG. 2 illustrates in schematic form a blanket film MEMS comprising an aluminium mask, a silicon dioxide layer located on top of a layer of silicon nitride (a) before etching and (b) after etching.

FIG. 2(a) presents a schematic representation of a blanket film MEMS 5 upon which an HF vapour etch is to be performed. The MEMS 5 can be seen to comprise a silicon substrate 16 upon which is located a silicon nitride layer 17, a sacrificial layer of silicon dioxide 18 and an aluminium masking layer 19.

Figure 2B:
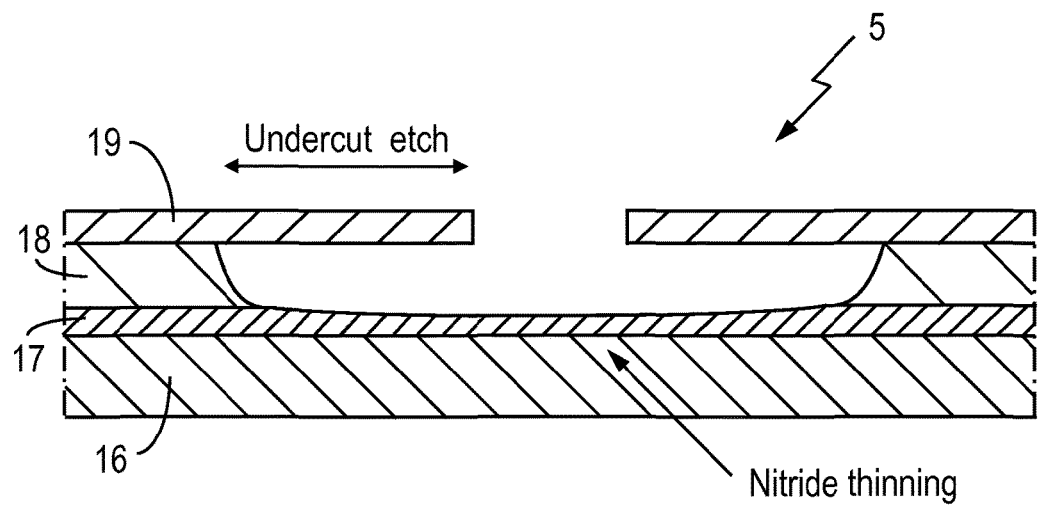

In order to etch the silicon dioxide layer 18 the MEMS 5 is initially located upon the pedestal 15 and the operating temperature and pressure within the process chamber 3 set. The HF and water vapours are then introduced to the process chamber 3 in order to etch the silicon dioxide layer 18, as presented in FIG. 2(b).

In practice there is found to be a high selectivity between the silicon dioxide layer 18 and the aluminium mask 19 in accordance with theoretical predictions i.e. there is no noticeable etching of the aluminium mask 19. However, the selectivity between the silicon dioxide layer 18 and the silicon nitride layer 17 is significantly lower than that with the aluminium mask 19 to the extent that significant levels of etching of the silicon nitride layer 17 occurs. By way of example, a MEMS 5 comprising a 1 □m thick layer of HDP silicon dioxide 18, a 220 nm thick layer of LPCVD silicon nitride 17 and a 200 nm thick aluminium mask 19 was HF vapour etched within the process chamber 3, at an operating temperature of 25° C. and at a process chamber pressure of 18 T, so as to produce an undercut of 10 □m. On completion of the etch (approximately 25 minutes) there remained a 200 nm thick aluminium mask 19 but only 55 nm of the silicon nitride layer 17 remained, 165 nm having been removed by the HF vapour etch.

The applicant has found that the introduction of a hydrogen compound gas e.g. hydrogen gas ($H_2$) from source 7 provides a means for increasing the selectivity to silicon nitride ($Si_3N_4$) during the hydrogen fluoride (HF) vapour etch of silicon dioxide ($SiO_2$). By way of example, a MEMS again comprising a 1 □m thick layer of HDP silicon dioxide 18, a 220 nm thick layer of LPCVD silicon nitride 17 and a 200 nm thick aluminium mask 19 was again HF vapour etched within the process chamber 3, at an operating temperature of 25° C. and at a process chamber pressure of 18 T, so as to produce an undercut of 10 □m. However, on this occasion 100 sccm of hydrogen gas ($H_2$) was also supplied to the process chamber 3. On completion of the HF vapour etch (approximately 25 minutes) there again remained a 200 nm thick aluminium mask 19 but now the remaining silicon nitride oxide layer was 210 nm thick i.e. only 10 nm had been removed. This represent a 16.5 times improvement in etch selectivity between the silicon dioxide layer 18 and the silicon nitride layer 17 when compared to the same process in the absence of the hydrogen gas.

Other hydrogen compound gases such as ammonia ($NH_3$), methane ($CH_4$) or ethane ($C_2H_6$) have alternatively been employed to provide an increased selectivity to the silicon nitride layer 17. In practice the best results have however been achieved using hydrogen gas. It will be appreciated that the hydrogen compound gas may comprise mixtures of two or more of the above mentioned hydrogen gas compounds.

The applicant has also found that reducing the operating temperature of the process chamber also provides a means for increasing the selectivity to silicon nitride ($Si_3N_4$) during the hydrogen fluoride (HF) vapour etch of silicon dioxide ($SiO_2$). On this occasion blanket films on a standard sample were etched and the selectivity at different temperatures investigated. The films employed for these tests comprised thermal silicon dioxide and PECVD silicon nitride layers. Employing the standard recipe at 25° C. described above the etch selectivity was 11:1 for these test structure. However, on cooling the test sample to 10° C., and readjusting the chamber pressure to give the same etch rate as above, resulted in the etch selectivity increasing to 38:1.

Tests across a range temperatures were carried out to further investigate the improvements in the selectivity to silicon nitride during an HF vapour etching of silicon dioxide. Somewhat surprisingly noticeable improvements were observed for operating temperatures as high 20° C.

It will be appreciated by the skilled reader that the above procedures may be combined i.e. as well as introducing a hydrogen compound gas into the process chamber 3 the operating temperature may simultaneously be reduced to 20° C. or below. The overall effect is to further improve the selectivity to silicon nitride during an HF vapour etch of silicon dioxide.

The following is provided by way of explanation of the observed results. Theoretical studies suggest that the main contribution to the etching of silicon dioxide ($SiO_2$) involve the difluoride reactive species within the HF vapour ($HF_2^-$ and $H_2F_2$) while the main contribution to the etching of silicon nitride ($Si_3N_4$) are believed to be the monofluoride reactive species ($F^-$, and HF). These etching processes may be described by the following reaction equations:

$$H^+ + HF_2^- + SiO_2 \rightleftharpoons SiF_4 + H_2O \quad (1)$$

$$H_2F_2 + SiO_2 \rightleftharpoons SiF_4 + H_2O \quad (2)$$

$$H^+ + F^- + Si_3N_4 \rightleftharpoons SiF_4 + NH_3 \quad (3)$$

$$HF + Si_3N_4 \rightleftharpoons SiF_4 + NH_3 \quad (4)$$

It is believed that the hydrogen compound gas generally tends to react more readily with the monofluoride species ($F^-$, and HF) of the HF vapour than with the difluoride species ($HF_2^-$ and $H_2F_2$). Thus the introduction of such a secondary gas acts to shift the equilibrium of the HF reactive species towards the difluoride species ($HF_2^-$ and $H_2F_2$) i.e. the ratio of difluoride reactive species ($HF_2^-$ and $H_2F_2$) to monofluoride reactive species ($F^-$, and HF) is increased. It is this effect that is believed to lead to the observed increase in the selectivity to silicon nitride ($Si_3N_4$) during the hydrogen fluoride (HF) vapour etch of silicon dioxide ($SiO_2$).

A secondary contribution may also be present when ammonia ($NH_3$) is employed as the hydrogen compound gas. Reaction equations (3) and (4) show that ammonia ($NH_3$) is produced as a by-product of an HF vapour etch of silicon nitride ($Si_3N_4$). Thus the introduction of ammonia ($NH_3$) tends to prohibit the silicon nitride ($Si_3N_4$) etch.

Due to entropy effects it is believed that reducing the operating temperature of the HF vapour etch process to 20° C. or below also results in the equilibrium of the HF reactive species shifting towards the difluoride species ($HF_2^-$ and $H_2F_2$) i.e. the ratio of difluoride reactive species to monofluoride reactive species is again increased. This again is believed to account for the observed increase in selectivity to silicon nitride ($Si_3N_4$) during the hydrogen fluoride (HF) vapour etch of silicon dioxide ($SiO_2$).

A secondary contribution may also be present when water vapour ($H_2O$) is employed as the catalyst. When the operating temperature is reduced the water vapour starts to condense on the exposed surfaces of the MEMS 5. Since water vapour ($H_2O$) acts as a catalyst for the HF vapour etch of silicon dioxide ($SiO_2$), reaction equations (1) and (2), it is believed that condensation effects act to increase the silicon dioxide ($SiO_2$) etch relative to the silicon nitride ($Si_3N_4$) etch.

As described previously, a number of other factors will affect the performance of an HF vapour etch performance e.g. gas flow rates, process chamber 3 pressure and the physical structure of the MEMS itself. However, by adding a suitable secondary gas and/or reducing the operating temperature for the HF vapour etch the ratio of the difluoride species ($HF_2^-$ and $H_2F_2$) to the monofluoride reactive species ($F^-$, and HF) is increased. As a result the applicants have been able to demonstrate significantly improved selectivity to silicon nitride ($Si_3N_4$) during the hydrogen fluoride (HF) vapour etch of silicon dioxide ($SiO_2$). Even small amounts of hydrogen gas have been seen to makes a significant difference in this selectivity.

While the above described embodiments employ a vacuum pump which pumps carrier gases, etch vapour, etch by-product and the secondary hydrogen compound gas out of the process chamber, thus creating a flow of etchant and hydrogen there through, it is also envisaged that the etchant and hydrogen compound gas could be recirculated.

The etching of a sacrificial silicon dioxide ($SiO_2$) portion in a microstructure such as a microelectro-mechanical structures (MEMS) by the use an etchant gas, namely hydrogen fluoride (HF) vapour is performed with greater selectivity to other portions within the MEMS, and in particular portions of silicon nitride ($Si_3N_4$). This is achieved by the addition of a secondary non-etchant gas suitable for increase the ratio of difluoride reactive species ($HF_2^-$ and $H_2F_2$) to monofluoride reactive species ($F^-$, and HF) within the HF vapour. The secondary non-etchant gas may comprise a hydrogen compound gas. The ratio of difluoride reactive species ($HF_2^-$ and $H_2F_2$) to the monofluoride reactive species ($F^-$, and HF) within the HF vapour can also be increased by setting an etch operating temperature to 20° C. or below.

The foregoing description of the invention has been presented for the purposes of illustration and description and is not intended to be exhaustive or to limit the invention to the precise form disclosed. The described embodiments were chosen and described in order to best explain the principles of the invention and its practical application to thereby enable others skilled in the art to best utilise the invention in various embodiments and with various modifications as are suited to the particular use contemplated. Therefore, further modifications or improvements may be incorporated without departing from the scope of the invention as defined by the appended claims.

The invention claimed is:

1. A method of increasing selectively etching of silicon dioxide ($SiO_2$) from silicon nitride ($Si_3N_4$) in a process chamber so as to produce one or more microstructures, the method comprising:
   providing the process chamber with a hydrogen fluoride (HF) etching vapour;
   setting a pressure of the process chamber to be in the range 18 Torr to 150 Torr; and
   increasing a ratio of difluoride reactive species ($HF_2^-$ and $H_2F_2$) to monofluoride reactive species ($F^-$, and HF) within the etching vapour by cooling an operating temperature to below 20° C.

2. A method of increasing selectively etching of silicon dioxide ($SiO_2$) as claimed in claim 1 wherein the step of increasing the ratio of difluoride reactive species ($HF_2^-$ and $H_2F_2$) to monofluoride reactive species ($F^-$, and HF) within the etching vapour further comprises providing the process chamber with a non-etchant gas.

3. A method of increasing selectively etching of silicon dioxide ($SiO_2$) as claimed in claim 2 wherein the non-etchant gas comprises a hydrogen compound gas.

4. A method of increasing selectively etching of silicon dioxide ($SiO_2$) as claimed in claim 3 wherein the hydrogen compound comprises a compound selected from the group of compounds consisting of hydrogen ($H_2$), ammonia ($NH_3$), methane ($CH_4$), ethane ($C_2H_6$) and mixtures thereof.

5. A method of increasing selectively etching of silicon dioxide ($SiO_2$) as claimed in claim 2 wherein the method further comprises controlling the amount of non etchant gas within the process chamber by controlling a vacuum pump rate out of the process chamber.

6. A method of increasing selectively etching of silicon dioxide ($SiO_2$) as claimed in claim 2 wherein the method comprises circulating the non etchant gas through the process chamber.

7. A method of increasing selectively etching of silicon dioxide ($SiO_2$) as claimed in claim 1 wherein the etch operating temperature is set to 10° C.

8. A method of increasing selectively etching of silicon dioxide ($SiO_2$) as claimed in claim 1 wherein the method further comprises providing the process chamber with a catalyst.

9. A method of increasing selectively etching of silicon dioxide ($SiO_2$) as claimed in claim 8 wherein the catalyst comprises water ($H_2O$) vapour.

10. A method of increasing selectively etching of silicon dioxide ($SiO_2$) as claimed in claim 1 wherein the method further comprises controlling the amount of etching vapour within the process chamber by controlling a vacuum pump rate out of the process chamber.

11. A method of increasing selectively etching of silicon dioxide ($SiO_2$) as claimed in claim 1 wherein the method comprises circulating the etching vapour through the process chamber.

12. A method of increasing selectively etching of silicon dioxide ($SiO_2$) as claimed in claim 1 wherein the method comprises the provision of a mask overlying the silicon dioxide so as to allow for selective etching of the silicon dioxide.

13. A method of increasing selectively etching of silicon dioxide ($SiO_2$) from silicon nitride ($Si_3N_4$) in a process chamber to produce one or more microstructures, the method comprising:
   providing the process chamber with a hydrogen fluoride (HF) etching vapour;
   setting a pressure of the process chamber to be in the range of 18 Torr to 150 Torr; and
   cooling an etch operating temperature to below 20° C.

14. A method of increasing selectively etching of silicon dioxide ($SiO_2$) from silicon nitride ($Si_3N_4$) in a process chamber so as to produce one or more microelectromechanical structures (MEMS), the method comprising:
   providing the process chamber with a hydrogen fluoride (HF) etching vapour;
   setting a pressure of the process chamber to be in the range 18 Torr to 150 Torr; and
   cooling an operating temperature to below 20° C.

* * * * *